United States Patent
Tzu Hsiang et al.

(10) Patent No.: US 11,948,884 B2
(45) Date of Patent: Apr. 2, 2024

(54) SEMICONDUCTOR DEVICE AND THE MANUFACTURING METHOD THEREOF

(71) Applicant: EPISTAR CORPORATION, Hsinchu (TW)

(72) Inventors: Lin Tzu Hsiang, Hsinchu (TW); Chen Chih Hao, Hsinchu (TW); Wu Wei Che, Hsinchu (TW); Chen Ying Chieh, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 130 days.

(21) Appl. No.: 17/410,668

(22) Filed: Aug. 24, 2021

(65) Prior Publication Data

US 2022/0068792 A1 Mar. 3, 2022

(30) Foreign Application Priority Data

Aug. 26, 2020 (TW) .................. 109129098

(51) Int. Cl.
*H01L 23/528* (2006.01)
*H01L 21/02* (2006.01)
(Continued)

(52) U.S. Cl.
CPC ...... *H01L 23/528* (2013.01); *H01L 21/02433* (2013.01); *H01L 21/2011* (2013.01); *H01S 5/0213* (2013.01)

(58) Field of Classification Search
CPC .............. H01L 21/78; H01L 21/02433; H01L 21/02516; H01L 21/2011; H01L 23/528;
(Continued)

(56) References Cited

U.S. PATENT DOCUMENTS

2011/0275172 A1* 11/2011 Okabe ................. H01L 33/0095
438/33
2013/0037825 A1* 2/2013 Hiraiwa ................. B23K 26/40
438/33

(Continued)

*Primary Examiner* — Galina G Yushina
(74) *Attorney, Agent, or Firm* — DITTHAVONG, STEINER & MLOTKOWSKI

(57) ABSTRACT

A semiconductor device includes: a substrate, including an upper surface and a first to a fourth side surfaces; wherein the upper surface includes a first edge connecting the first side surface and a second edge opposite to the first edge and connecting the second side surface; a first modified trace formed on the first side surface; and a semiconductor stack formed on the upper surface, including a lower surface connecting the upper surface of the substrate, and the lower surface comprises a fifth edge adjacent to the first edge and a sixth edge opposite to the fifth edge and adjacent to the second edge; wherein a shortest distance between the first edge and the fifth edge is S1 μm, and a shortest distance between the second edge and the sixth edge is S2 μm; wherein in a lateral view viewing from the third side surface, the first side surface forms a first acute angle with a degree of θ1 with the vertical direction, the second side surface forms a second acute angle with a degree of θ2 with the vertical direction, and a distance between the first modified trace and the upper surface in the vertical direction is D1 μm; and wherein S1, S2, θ1, θ2 and D1 satisfy the equation: $D1 \leq 0.2 \times (S1+S2)/\tan \theta a$, wherein $\theta a = (\theta 1 + \theta 2)/2$.

19 Claims, 7 Drawing Sheets

(51) Int. Cl.
*H01L 21/20* (2006.01)
*H01S 5/02* (2006.01)

(58) Field of Classification Search
CPC .............. H01L 23/562; H01L 33/0066; H01L 33/0093; H01L 33/0095; H01L 2924/1067; H01L 21/76894; H01S 5/0213; H01S 3/1636
See application file for complete search history.

(56) References Cited

U.S. PATENT DOCUMENTS

2014/0353705 A1* 12/2014 Kamikawa ............ H01L 21/268
  257/98
2017/0309783 A1* 10/2017 Chen .................. H01L 33/16

* cited by examiner

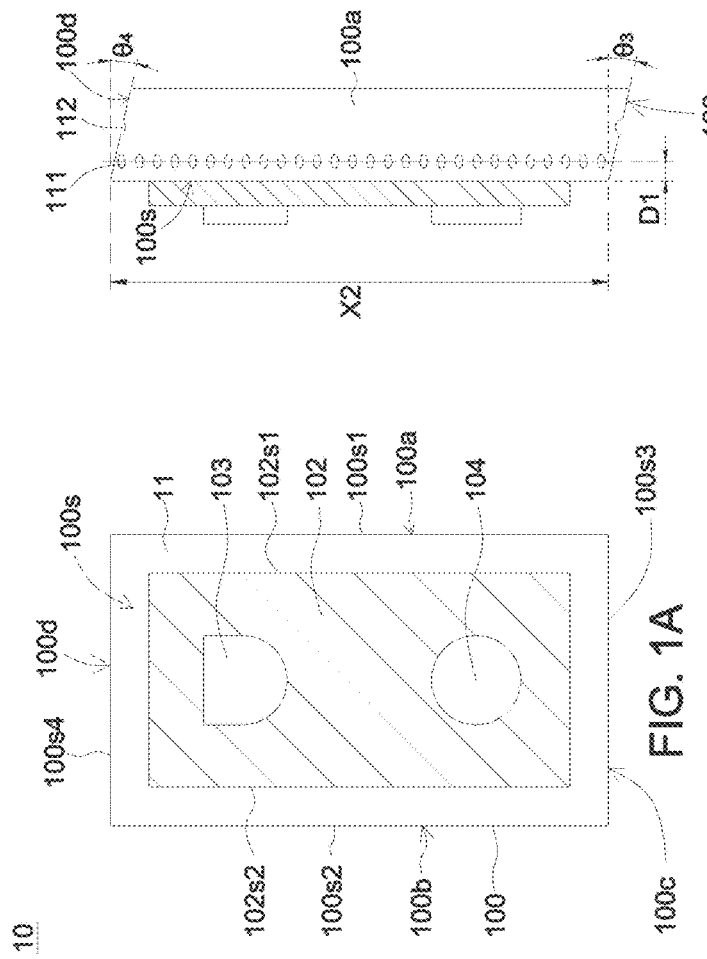
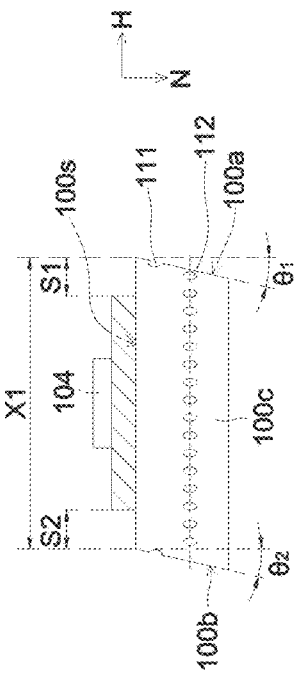
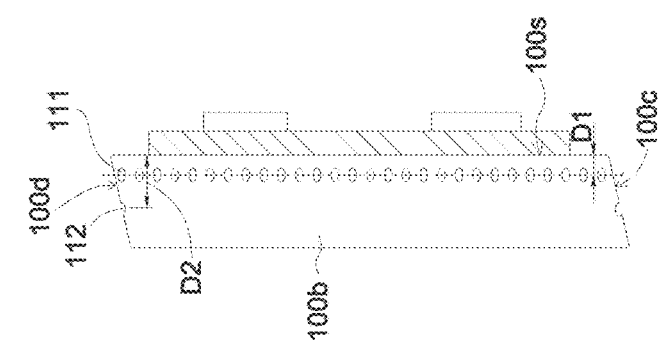
FIG. 1A
FIG. 1B
FIG. 1C
FIG. 1D

SEMICONDUCTOR DEVICE AND THE MANUFACTURING METHOD THEREOF

CROSS REFERENCE TO RELATED APPLICATIONS

This application claims priority to the benefit of Taiwan Patent Application Number 109129098 filed on Aug. 26, 2020, and the entire contents of which are hereby incorporated by reference herein in its entirety.

BACKGROUND

Technical Field

The present application relates to a semiconductor device and a manufacturing method thereof, more particularly, to a semiconductor device having a laser-diced substrate and a manufacturing method thereof.

Description of the Related Art

With the development of technology, III-V semiconductors can be manufactured into various semiconductor components and are widely used in lighting, medical care, display, communication, sensing, power supply systems and other fields. This application discloses a semiconductor device and a manufacturing method thereof to improve the yield of the semiconductor device.

SUMMARY

A semiconductor device includes: a substrate, including an upper surface, a first side surface, a second side surface opposite to the first side surface, a third side surface connecting the first side surface and the second side surface, and a fourth side surface opposite to the third side surface; wherein the upper surface includes a first edge connecting the first side surface, a second edge opposite to the first edge and connecting the second side surface, a third edge connecting the third side surface, and a fourth edge opposite to the third edge and connecting the fourth side surface; a horizontal direction parallel to the upper surface and a vertical direction perpendicular to the upper surface; a first modified trace formed on the first side surface; and a semiconductor stack formed on the upper surface, including a lower surface connecting the upper surface of the substrate, and the lower surface comprises a fifth edge adjacent to the first edge and a sixth edge opposite to the fifth edge and adjacent to the second edge; wherein a shortest distance between the first edge and the fifth edge is S1 μm, and a shortest distance between the second edge and the sixth edge is S2 μm; wherein in a lateral view viewing from the third side surface, the first side surface forms a first acute angle with a degree of θ1 with the vertical direction, the second side surface forms a second acute angle with a degree of θ2 with the vertical direction, and a distance between the first modified trace and the upper surface in the vertical direction is D1 μm; and wherein S1, S2, θ1, θ2 and D1 satisfy the equation: D1≤0.2×(S1+S2)/tan θa, wherein θa=(θ1+θ2)/2.

BRIEF DESCRIPTION OF THE DRAWINGS

FIG. 1A shows a top view of a semiconductor device 1 in accordance with an embodiment of the present application.

FIG. 1B shows a first lateral view of the semiconductor device 1 in accordance with an embodiment of the present application.

FIG. 1C shows a second lateral view of the semiconductor device 1 in accordance with an embodiment of the present application.

FIG. 1D shows a third lateral view of the semiconductor device 1 in accordance with an embodiment of the present application.

DETAILED DESCRIPTION OF THE EMBODIMENTS

Figure 2A:
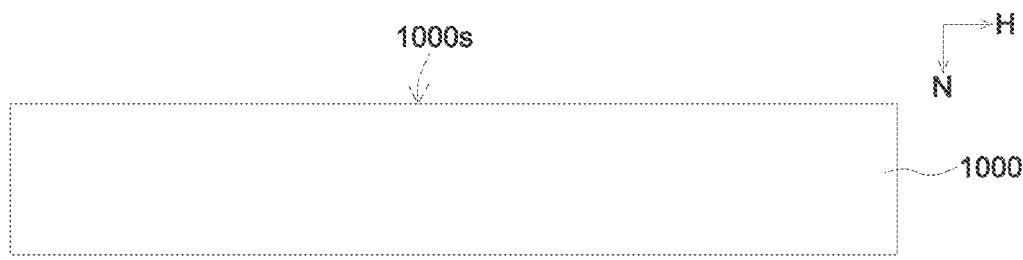
FIGS. 2A-2I show a manufacturing method for the semiconductor device 1 in accordance with an embodiment of the present application.

To better and concisely explain the disclosure, the same name or the same reference number given or appeared in different paragraphs or figures along the specification should has the same or equivalent meanings while it is once defined anywhere of the disclosure.

FIGS. 1A to 1D show a semiconductor device 1 in accordance with an embodiment of the present application. FIG. 1A shows a top view of the semiconductor device 10. FIG. 1B shows a first lateral view of the semiconductor device 10. FIG. 1C shows a second lateral view of the semiconductor device 10. FIG. 1D shows a third lateral view of the semiconductor device 10. As shown in FIGS. 1A to 1D, the semiconductor device 10 includes a substrate 100, a semiconductor stack 102, a first electrode 103, a second electrode 104, a first modified trace 111 and a second modified trace 112. Specifically, the substrate 100 includes an upper surface 100s, a first side surface 100a, a second side surface 100b opposite to the first side surface 100a, a third side surface 100c connecting the first side surface 100a and the second side surface 100b, and a fourth side surface 100d opposite to the third side surface 100c and connecting the first side surface 100a and the second side surface 100b. The upper surface 100s includes a first edge 100s1 connected to the first side surface 100a, a second edge 100s2 opposite to the first edge 100s1 and connected to the second side surface 100b, a third edge 100s3 connected to the third side surface 100c, and a fourth edge 100s4 opposite to the third edge 100s3 and connected to the fourth side surface 100d.

The material of the substrate 100 is, for example, sapphire. The horizontal direction H is perpendicular with a normal direction of the upper surface 100s. The vertical direction N is perpendicular to the upper surface 100s. The first modified trace 111 is formed on the first side surface 100a and the second side surface 100b. The first modified trace 111 includes a plurality of modified spots 116 arranged along the horizontal direction H as shown in FIG. 1D. In one embodiment, the plurality of modified spots 116 are separated from each other and not connected, and each modified spot 116 is a recess recessed inward from the first side surface 100a or the second side surface 100b. The distance between the first modified trace 111 and the upper surface 100s in the vertical direction N is D1 μm.

The semiconductor stack 102 is formed on the upper surface 100s of the substrate 100. As shown in FIG. 1A, the area of the semiconductor stack 102 is smaller than the area of the upper surface 100s of the substrate 100 so that a portion of the upper surface 100s of the substrate 100 is not covered by the semiconductor stack 102. The portion of the upper surface 100s of the substrate 100 not covered by the semiconductor stack 102 serves as dicing streets 11 so that the semiconductor stack 102 can be prevented from being damaged during the dicing process. In the top view, the dicing street 11 surrounds the semiconductor stack 102. In one embodiment, in the top view, the substrate 100 has a rectangular shape with long edges and short edges, wherein the length of the long edge is greater than the length of the short edge. The first edge 100s1 and the second edge 100s2 are the long edges. The third edge 100s3 and the fourth edge 100s4 are the short edges. The length of the first edge 100s1 and the second edge 100s2 are X2 μm, the length of the third edge 100s1 and the fourth edge 100s2 are X1 μm, wherein X2>X1. In one embodiment, 50≤X1≤200 and 75≤X2≤300.

Figure 4:
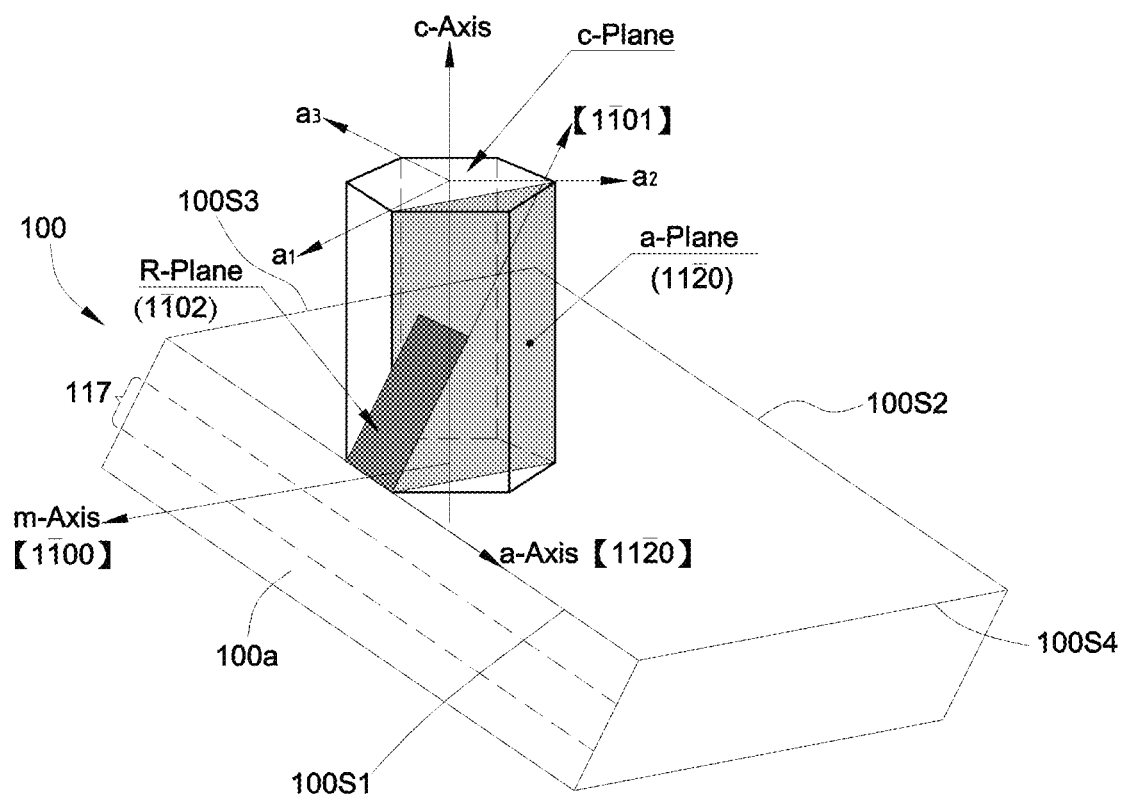
FIG. 4 shows a perspective view of the substrate 100 and the crystal orientation of a hexagonal single crystal system material thereof in accordance with an embodiment of the present application.

As shown in FIG. 1B, when viewing from the third side surface 100c, the first side surface 100a forms a first acute angle with a degree of θ1 with the vertical direction N, and the second side surface 100b forms a second acute angle with a degree of θ2 with the vertical direction N. In one embodiment, the first edge 100s1 and the second edge 100s2 are approximately perpendicular to the m-axis of the sapphire as shown in FIG. 1A and FIG. 4 (e.g., m-axis [1$\bar{1}$00]). The first acute angle and the second acute angle are approximately the same or the difference therebetween is less than 2 degrees. Therefore, the first acute angle and the second acute angle can be generally expressed as an average angle θa of the two, that is, θa=(θ1+θ2)/2. In one embodiment, 2°≤θa≤13°. In another embodiment, the first edge 100s1 and the second edge 100s2 are substantially perpendicular to the a-axis of the sapphire as shown in FIG. 1A and FIG. 4 (e.g., a-axis [11$\bar{2}$0]). As shown in FIG. 1A, the semiconductor stack 102 includes a lower surface connected to the upper surface 100s of the substrate 100, and the lower surface of the semiconductor stack 102 includes a fifth edge 102s1 adjacent to the first edge 100s1 of the substrate 100 and a sixth edge 102s2 opposite to the fifth edge 102s1 and adjacent to the second edge 100s2 of the substrate 100. In one embodiment, as shown in FIG. 1B, in the horizontal direction H parallel to the upper surface 100s, a distance between the first edge 100s1 of the substrate 100 and the fifth edge 102s1 of the semiconductor stack 102 is S1 μm, the distance between the second edge 100s2 of the substrate 100 and the sixth edge 102s2 of the semiconductor stack 102 is S2 μm, where S1>S2, and the following equations are satisfied: The distance between the first modified trace 111 on the first side surface 100a and the semiconductor stack 102 in the horizontal direction is (S1−D1×tan θa); The distance between the first modified trace 111 on the second side surface 100b and the semiconductor stack 102 in the horizontal direction is (S2+D1×tan θa); and $$(S1-D1\times\tan\theta a)=(S2+D1\times\tan\theta a);$$

then (S1−S2)=2×D1×tan θa equation (a) can be obtained.
The difference between S1 and S2 represents the variability of the side surfaces of the substrate during laser dicing. In order to avoid damaging the semiconductor stack 102 during dicing, which may degrade the yield of the semiconductor device 10, S1 and S2 are set to satisfy:

$$0\leq(S1-S2)/(S1+S2)\leq0.4 \quad\text{equation (b)}$$

Substituting equation (a) into equation (b):

$$D1\leq0.2\times(S1+S2)/\tan\theta a \quad\text{equation (c) can be obtained.}$$

In one embodiment, (S1−S2)≤7 μm.
In one embodiment, as shown in FIG. 1C, which viewing from the first side surface 100a, a third acute angle is formed between the third side surface 100c and the vertical direction N with a degree of θ3. A fourth acute angle is formed between the fourth side surface 100d and the vertical direction N with a degree of θ4. The third edge 100s3 and the fourth edge 100s4 are perpendicular to a crystal axis of the sapphire, for example, perpendicular to the a-axis [11$\bar{2}$0] of the sapphire, as shown in FIG. 4. The third acute angle and the fourth acute angle are approximately the same or the difference therebetween is less than 1 degree, so the third acute angle and the fourth acute angle can be generally expressed as an average angle θb of the two, that is, θb=(θ3+θ4)/2, and θb≤θa. In one embodiment, 0≤θb≤2°. In another embodiment, the third edge 100s3 and the fourth edge 100s4 are perpendicular to the m-axis [1$\bar{1}$00] of sapphire, as shown in FIG. 4. The semiconductor device 10 further includes a second modified trace 112 on the third side surface 100c and the fourth side surface 100d, wherein the distance between the second modified trace 112 and the upper surface 100s of the substrate 100 in the vertical direction N is D2 μm, and wherein D2≠D1. In one embodiment, D2>D1; for example, D2≥2×D1. In another embodiment, 10≤D1≤60. In one embodiment, the thickness of the substrate 100 ranges from 50 μm to 200 μm. The first electrode 103 and the second electrode 104 are located on and electrically connected to the semiconductor stack 102. The first electrode 103 and the second electrode 104 are used to electrically connect to other components or an external power source.

FIGS. 2A-2H show a manufacturing method of the semiconductor device in accordance with one embodiment of the present application. FIGS. 2A to 2D show lateral views of the steps in the manufacturing method. FIGS. 2E to 2H show the partial top views and the corresponding lateral views in the steps of the manufacturing method. The manufacturing method includes the following steps:

Step 1. Providing a wafer substrate: As shown in FIG. 2A, a wafer substrate 1000 in provided. The wafer substrate 1000 includes an upper surface 1000s, the horizontal direction H is parallel to the upper surface 1000s and the vertical direction N is perpendicular to the upper surface 1000s.

Figure 2B:
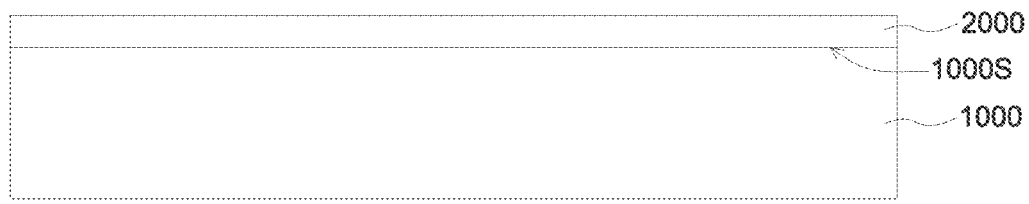

Step 2: Forming a semiconductor film: As shown in FIG. 2B, a semiconductor film 2000 is epitaxially grown on the upper surface 1000s of the wafer substrate 1000.

Figure 2C:
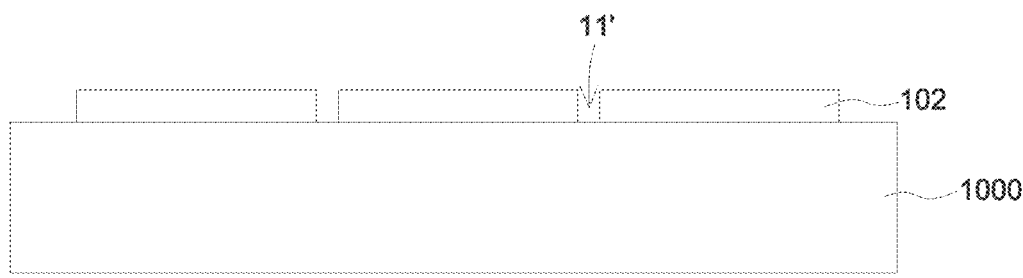

Step 3. Forming dicing streets: As shown in FIG. 2C, a portion of the semiconductor film 2000 is removed to form a plurality of separated semiconductor stacks 102 and expose a portion of the upper surface of the wafer substrate 1000. The exposed area of the substrate wafer substrate 1000 acts as the dicing streets 11' during the subsequent substrate dicing process.

Figure 2D:
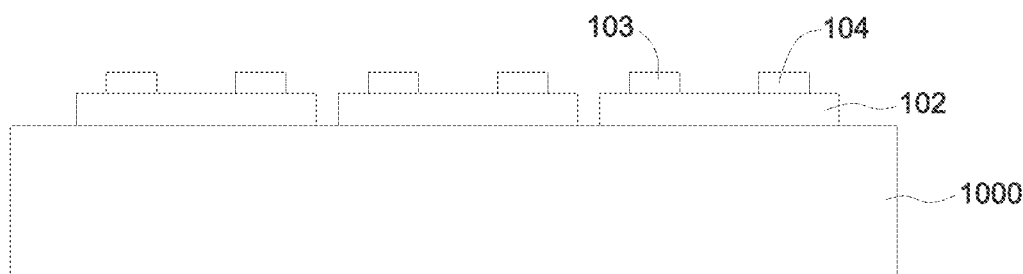
Figure 2E:
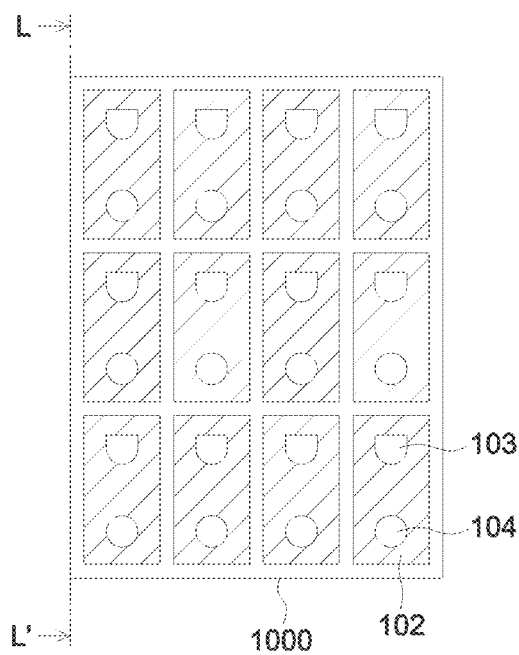

Step 4. Forming electrodes: The first electrode 103 and the second electrode 104 are formed on the semiconductor stack 102. After Step 4 is finished, the top view is shown as FIG. 2E. FIG. 2D is a schematic diagram of a lateral view from the direction L in FIG. 2E. In the top view shown as FIG. 2E, each semiconductor stack 102 is rectangular and has a pair of long edges and a pair of short edges.

Figure 2F:
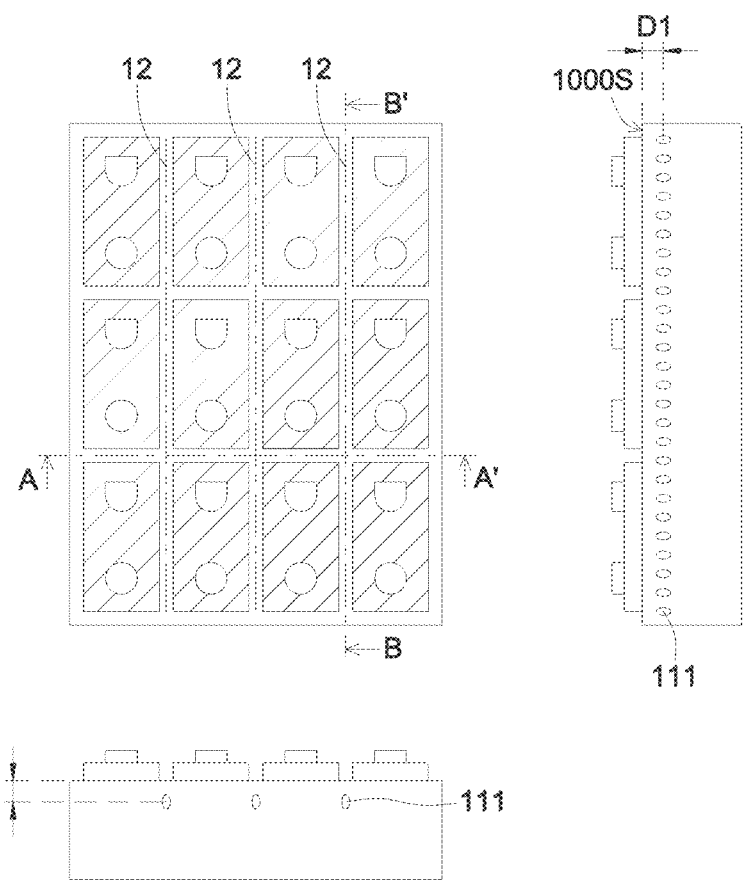

Step 5. Performing a first dicing step: As shown in FIG. 2F, a stealth laser dicing is performed along predefined dicing lines 12 parallel with the long edge of the semiconductor stack 102. The first dicing step includes irradiating a laser to focus at a predefined depth D1 μm inside the wafer substrate 1000. The laser focused regions inside the wafer substrate 1000 are physically and/or chemically modified to form the first modified trace 111. In the embodiment, the laser can incident from the upper surface 1000s or the lower surface of the wafer substrate 1000 to focus on the inside of the wafer substrate 1000. In an embodiment, the first modified trace 111 includes a plurality of separate spots linearly arranged along the dicing lines 12. The distance between the first modified trace 111 and the upper surface 1000s in the vertical direction N is D1 μm. The bottom figure shown in FIG. 2F is a lateral view viewing from a cross-section along the AA' line. The right figure in FIG. 2F is a lateral view viewing from a cross-section along the BB' line.

Figure 2G:
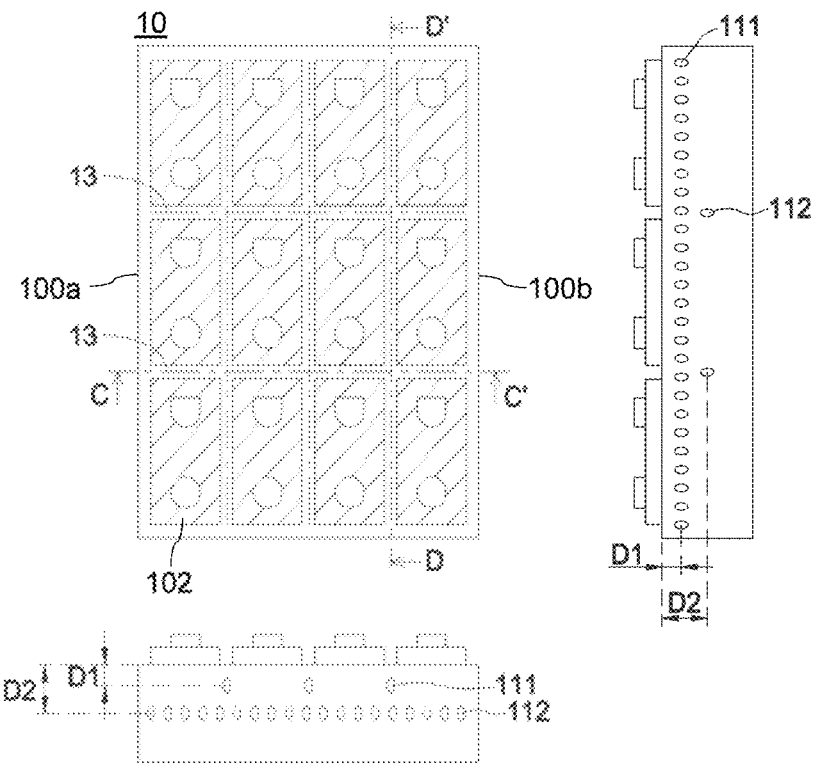

Step 6. Performing a second dicing step: As shown in FIG. 2G, a stealth laser dicing is performed along predefined dicing lines 13 parallel with the short edge of the semiconductor stack 102. The second dicing step includes irradiating a laser to focus at a predetermined depth D2 μm inside the wafer substrate 1000. The laser focused regions inside the wafer substrate 1000 are physically and/or chemically modified to form the second modified trace 112. In an embodiment, the second modified trace 112 includes a plurality of separate spots linearly arranged along the dicing lines 13. The distance between the second modified trace 112 and the upper surface 1000s in the vertical direction N is D2 μm. In the present embodiment, D2>D1. The bottom figure shown in FIG. 2G is a lateral view viewing from a cross-section along the CC' line. The right figure in FIG. 2F is a lateral view viewing from a cross-section along the DD' line.

Step 7. Performing a separation step: The wafer substrate 1000 is separated into a plurality of semiconductor devices 10 as shown in FIGS. 1A to 1D along the dicing lines 12 and 13 by forming the modified traces 111 and 112 in the wafer substrate 1000. The wafer substrate 1000 is split from the first modified traces 111 toward the upper and the lower regions of the first modified traces 111 to form the first side surface 100a and the second side surface 100b of the semiconductor device 10. The wafer substrate 1000 is split from the second modified traces 112 toward the upper and the lower regions of the second modified traces 112 to form the third side surface 100c and the fourth side surface 100d of the semiconductor device Therefore, the degrees of the first acute angle and the second acute angle can be determined by the first modified traces 111, the characteristics of crystal surface of the first side surface 100a and the second side surface 100b. Similarly, the degrees of the third acute angle and the fourth acute angle can be determined by the second modified traces 112, the characteristics of crystal surface of the third side surface 100a and the fourth side surface 100b.

In the manufacturing method in accordance with the embodiment, the predefined depth D1 in the first dicing step can be optimized based on experiments so that the semiconductor device 10 satisfies: $D1 < 0.2 \times (S1+S2)/\tan\theta a$.

Figure 2H:
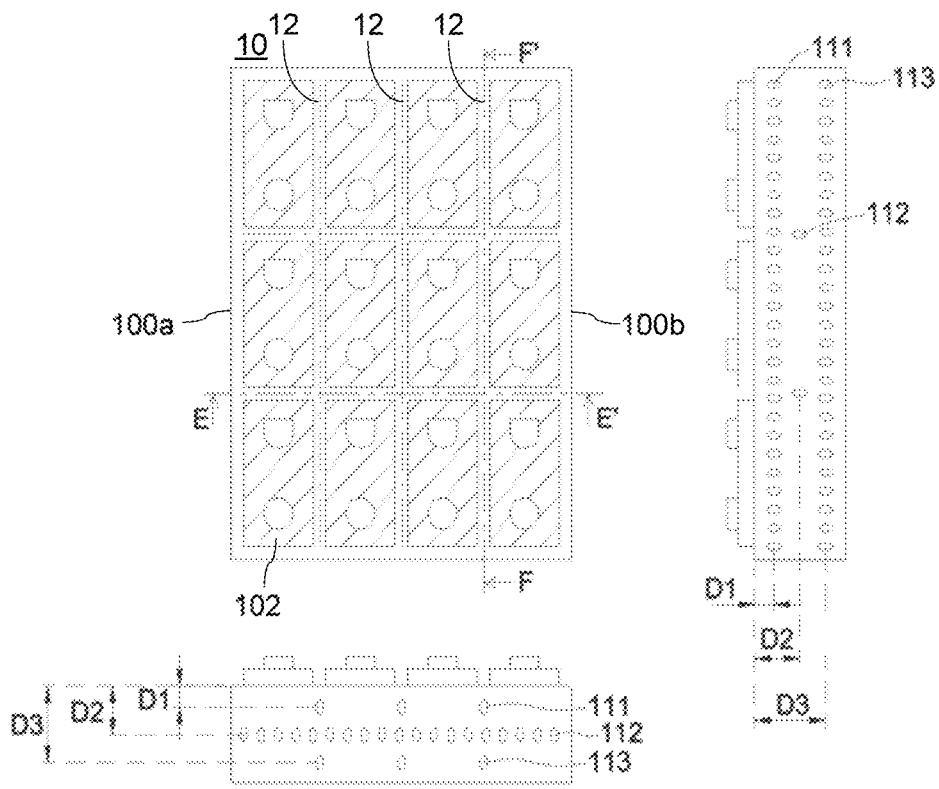

In another embodiment, the manufacturing method further includes a third dicing step after Step 6 and before Step 7. As shown in FIG. 2H, a stealth laser dicing is performed along the dicing lines 12 parallel with the long edge of the semiconductor stack 102. The third dicing step includes irradiating a laser to focus at a predefined depth D3 μm inside the wafer substrate 1000. The laser focused regions inside the wafer substrate 1000 are physically and/or chemically modified to form a third modified trace 113. In an embodiment, the third modified trace 113 is parallel with the first modified trace 111 and includes a plurality of separate spots linearly arranged along the dicing lines 12. The distance between the third modified trace 113 and the upper surface 1000s in the vertical direction N is D3 μm. In the present embodiment, D3>D1 and D3>D2. The bottom figure shown in FIG. 2H is a lateral view viewing from a cross-section along the EE' line. The right figure in FIG. 2H is a lateral view viewing from a cross-section along the FF' line. In the subsequent separation step in Step 7, the wafer substrate 1000 is split from the modified traces 111 and 113 toward the upper and the lower regions of the modified traces 111 and 113 to form the first side surface 100a and the second side surface 100b of the semiconductor device 10. Therefore, the first modified trace 111 and the third modified trace 113 are both formed on the first side surface 100a and the second side surface 100b of the semiconductor device 10. As shown in FIG. 2H and FIG. 4, in an embodiment, the part 117 of the first side surface 100a between the first modified trace 111 and the third modified trace 113 is the r-plane (1102) of sapphire.

In one embodiment, the third dicing step can be selectively performed on the crystal plane of the wafer substrate 1000 which is more likely to have oblique cracks, such as the m-plane of sapphire. The third modified trace 113 prevents the crack of the wafer substrate in the dicing streets 11' from extending to directly under the semiconductor stack 102 and damaging the semiconductor stack 102.

In another embodiment, in the third dicing step, the stealth laser dicing is performed on the wafer substrate 1000 not along the predefined dicing line 12. Instead, the stealth laser dicing is performed along another dicing line (not shown) that is located in the dicing street 11' and parallel to the dicing line 12 in the horizontal direction H with a constant distance. By setting the distance between that dicing line and the dicing line 12, after the wafer substrate 1000 is split along the modified traces 111 and 113 to form the plurality of semiconductor device 10, the surface between the first modified trace 111 and the third modified trace 113 on the first side surface 100a (and the side surface 100b) is the r-plane of sapphire or substantially parallel to the r-plane of sapphire.

Figure 2I:
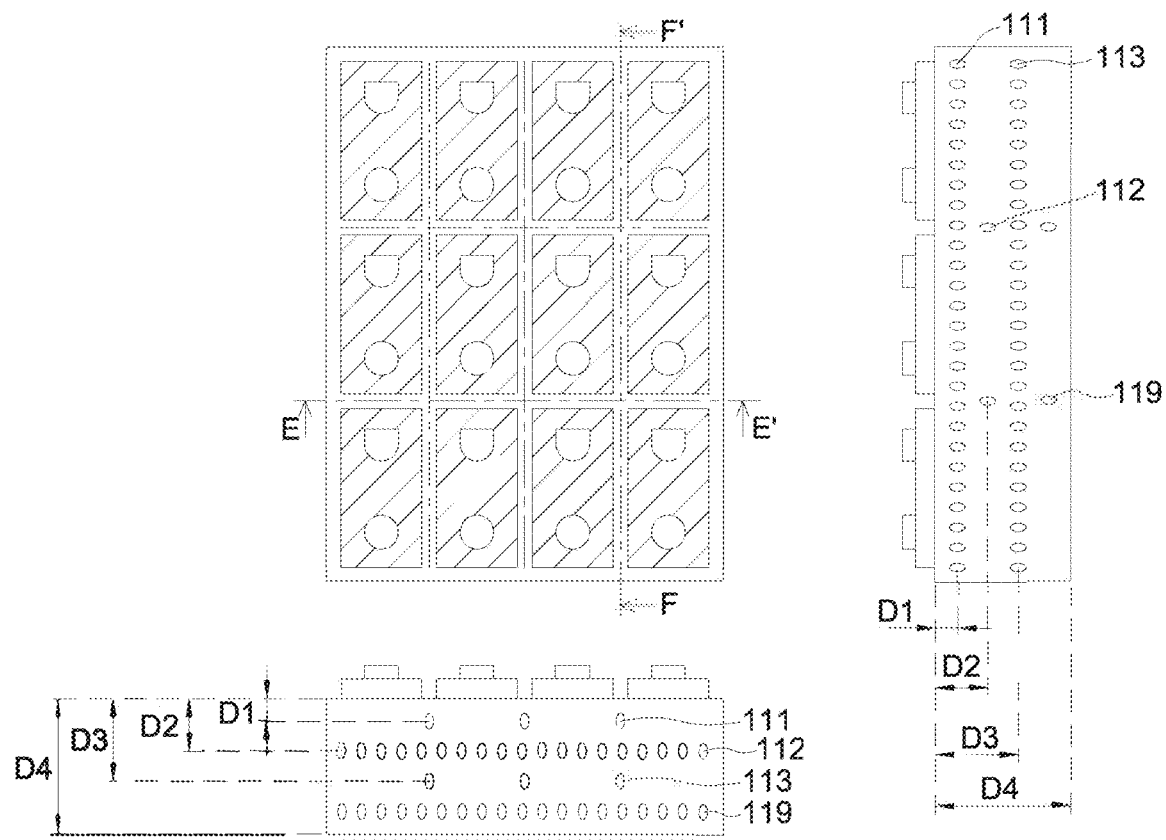

In another embodiment, as shown in FIG. 2I, a fourth dicing step can be optionally performed after the third dicing step. A stealth laser dicing is performed along the dicing lines 13 parallel with the short edge of the semiconductor stack 102. The fourth dicing step includes irradiating a laser to focus at a predefined depth D4 μm inside the wafer substrate 1000. The laser focused regions inside the wafer substrate 1000 are physically and/or chemically modified to form a fourth modified trace 119 as shown in FIG. 2I. In an embodiment, the fourth modified trace 119 is parallel with the second modified trace 112 and includes a plurality of separate spots linearly arranged along the dicing lines 13. The distance between the fourth modified trace 119 and the upper surface 1000s in the vertical direction N is D4 μm. In the present embodiment, D4>D3 and D4>D2.

In another embodiment, different laser parameters can be applied in the first dicing step and the third dicing step, and/or different laser parameters can be applied in the second dicing step and the fourth dicing step. In order to prevent the semiconductor stack from damaging by the excessive laser energy, when the laser is focused on the wafer substrate 1000 at a depth closer to the semiconductor stack, the laser can be performed with a lower frequency and/or a lower energy. For example, the laser energy used in the first dicing step is less than the laser energy used in the third dicing step, and/or the laser energy used in the second dicing step is less than the laser energy used in the fourth dicing step.

In another embodiment, different laser parameters can be applied in the dicing steps in different extension directions of the semiconductor stack 102. For example, the laser parameters used in the first dicing step can be different from the laser parameters used in the second dicing step. For example, on the crystal plane of the wafer substrate that is more easily to have oblique cracks, such as the m-plane of sapphire, the laser with higher energy or higher frequency can be used.

In another embodiment, the first dicing step is performed in the extending direction parallel to the short edge of the semiconductor stack 102, and the second dicing step is performed in the extending direction parallel to the long edge of the semiconductor stack 102.

Figure 3:
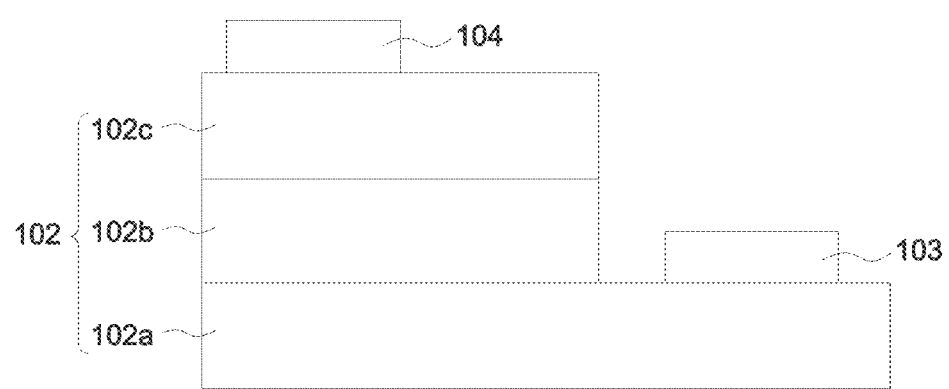
FIG. 3 shows a cross-sectional view of a semiconductor stack of the semiconductor device 1 in accordance with an embodiment of the present application.

In the embodiment described above, as shown in FIG. 3, the semiconductor stack 102 includes a light-emitting stack. The light-emitting stack includes a first semiconductor layer 102a on the substrate 100 (not shown in FIG. 3), an active region 102b on the first semiconductor layer 102a and a second semiconductor layer 102c on the active region 102b. The first semiconductor layer 102a has a first conductivity type and the second semiconductor layer 102c has a second conductivity type different from the first conductivity type. For example, the first conductivity type is n-type and the first semiconductor layer 102a provides electrons to the active region 102b. The second conductivity type is p-type and the second semiconductor layer 102c provides holes to the active region 102b. The electrons and holes are combined in the active region 102b to generate light with a specific wavelength. The first electrode 103 is located on and electrically connected to the first semiconductor layer 102a and the second electrode 104 is located on and electrically connected to the second semiconductor layer 102c.

In the embodiment described above, the substrate 100 is a growth substrate for epitaxial growth of the semiconductor stack 102 thereon by, for example, metal organic chemical vapor deposition (MOCVD). In one embodiment, the upper surface 100s of the substrate 100 includes a plurality of protrusions separated from each other which changes the path of the light to increase the light extraction efficiency. In one embodiment, the protrusions are formed by patterning the surface of the substrate 100 to a depth, and therefore have the same material as the substrate 100. In another embodiment, a light-transmitting material is formed on the upper surface of the substrate 100, and then the light-transmitting material is patterned to form the protrusions so that the protrusions include different material from that of the substrate 100.

In one embodiment, the plurality of protrusions is formed between the semiconductor stack 102 and the substrate 100, and is not formed on the dicing streets 11 of the substrate 100. In another embodiment, the substrate 100 can be a carrier substrate, and a bonding layer (not shown) is additionally formed between the substrate 100 and the semiconductor stack 102. The semiconductor stack 102 is epitaxially grown on a growth substrate, and then is bonded to the substrate 100 through the bonding layer by the process such as wafer bonding. The bonding layer is transparent to the light generated from the semiconductor stack 102, and the material of the bonding layer can be an insulating material and/or a conductive material. Insulating material includes polyimide, benzocyclobutene (BCB), perfluorocyclobutane (PFCB), MgO, Sub, epoxy, acrylic resin, cycloolefin polymer (COC), PMMA, PET, PC, polyetherimide, fluorocarbon polymer, glass, $Al_2O_3$, $SiO_x$, $TiO_2$, $SiN_x$ or spin-on glass (SOG). Conductive material includes indium tin oxide, indium oxide, tin oxide, cadmium tin oxide, antimony tin oxide, aluminum zinc oxide, zinc tin oxide, zinc oxide, indium zinc oxide, tantalum oxide, diamond-like carbon (DLC) or gallium zinc oxide. In one embodiment, the dicing street exposes the upper surface of the bonding layer. The manufacturing method further includes cutting the bonding layer by a UV laser, and then performing the stealth dicing laser to dice the substrate 100 as described in the aforementioned embodiments.

The semiconductor stack 102 includes III-V compound semiconductor material, such as AlInGaN based material or AlInGaP based material. The AlInGaN based material can be expressed as $(Al_{y1}In_{(1-y1)})_{1-y2}Ga_{y2}N$, $0 \leq y1 \leq 1$, $0 \leq y2 \leq 1$. The AlInGaP based material can be expressed as $(Al_{y1}In_{(1-y1)})_{1-y2}Ga_{y2}P$, $0 \leq y1 \leq 1$, $0 \leq y2 \leq 1$. The first electrode 103 and the second electrode 104 can be a single layer or a multi-layered structure. The materials of the first electrode 103 and the second electrode 104 include metal selected from nickel (Ni), titanium (Ti), platinum (Pt), palladium (Pd), silver (Ag), gold (Au), aluminum (Al) and copper (Cu).

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A semiconductor device, comprising:
    a substrate, comprising an upper surface, a first side surface, a second side surface opposite to the first side surface, a third side surface connecting the first side surface and the second side surface, and a fourth side surface opposite to the third side surface;
        wherein the upper surface comprises a first edge connecting the first side surface, a second edge opposite to the first edge and connecting the second side surface, a third edge connecting the third side surface, and a fourth edge opposite to the third edge and connecting the fourth side surface;
    a horizontal direction parallel to the upper surface and a vertical direction perpendicular to the upper surface;
    a first modified trace formed on the first side surface; and
    a semiconductor stack formed on the upper surface, comprising a lower surface connecting the upper surface of the substrate, and the lower surface comprises a fifth edge adjacent to the first edge and a sixth edge opposite to the fifth edge and adjacent to the second edge;
        wherein a shortest distance between the first edge and the fifth edge is S1 μm, and a shortest distance between the second edge and the sixth edge is S2 μm;
        wherein in a lateral view viewing from the third side surface, the first side surface forms a first acute angle with a degree of θ1 with the vertical direction, the second side surface forms a second acute angle with a degree of θ2 with the vertical direction, and a distance between the first modified trace and the upper surface in the vertical direction is D1 μm; and wherein S1, S2, θ1, θ2 and D1 satisfy the equation:

$$D1 \leq 0.2 \times (S1+S2)/\tan \theta a, \text{ wherein } \theta a=(\theta 1+\theta 2)/2.$$

2. The semiconductor device according to claim 1, wherein 2°≤θa≤13°.

3. The semiconductor device according to claim 1, wherein 10 μm≤D1 μm≤60 μm.

4. The semiconductor device according to claim 1, wherein S1>S2 and 0≤(S1−S2)/(S1+S2)≤0.4.

5. The semiconductor device according to claim 4, wherein (S1-S2) μm≤7 μm.

6. The semiconductor device according to claim 1, wherein in a lateral view viewing from the first side surface, the third side surface forms a third acute angle with a degree of θ3 with the vertical direction, and the fourth side surface forms a fourth acute angle with a degree of θ4 with the vertical direction, θb=(θ3+θ4)/2, and wherein θb<θa.

7. The semiconductor device according to claim 6, wherein 0°≤θb≤2°.

8. The semiconductor device according to claim 1, wherein a length of each of the first edge and the second edge is X2 μm, and a length of each of the third edge and the fourth edge is X1 μm, and wherein X2 μm>X1 μm and 50 μm≤X1 μm≤200 μm.

9. The semiconductor device according to claim 8, wherein 75 μm≤X2 μm≤300 m.

10. The semiconductor device according to claim 1, wherein a thickness of the substrate ranges from 50 μm to 200 μm.

11. The semiconductor device according to claim 1, further comprising a second modified trace formed on the third side surface;
wherein a distance between the second modified trace and the upper surface in the vertical direction is D2 μm and D2≠D1.

12. The semiconductor device according to claim 11, further comprising a third modified trace formed on the first side surface;
wherein a distance between the third modified trace and the upper surface in the vertical direction is D3 μm and D3>D2>D1.

13. The semiconductor device according to claim 12, wherein the substrate comprises sapphire, and a part of the first side surface between the first modified trace and the third modified trace is the r-plane of sapphire or substantially parallel with the r-plane of sapphire.

14. The semiconductor device according to claim 12, further comprising a fourth modified trace formed on the third side surface;
wherein a distance between the fourth modified trace and the upper surface in the vertical direction is D4 μm and D4>D3>D2>D1.

15. The semiconductor device according to claim 1, wherein the substrate comprises sapphire, and the first edge and the second edge are perpendicular to the m-axis of the sapphire.

16. The semiconductor device according to claim 1, wherein the substrate comprises sapphire, and the third edge and the fourth edge are perpendicular to the a-axis of the sapphire.

17. The semiconductor device according to claim 1, wherein the first modified trace comprises a plurality of modified spots arranged along the first edge.

18. The semiconductor device according to claim 1, wherein a difference between the first acute angle and the second acute angle is less than 2°.

19. The semiconductor device according to claim 1, wherein the semiconductor stack comprises a first semiconductor layer on the substrate, an active region on the first semiconductor layer and a second semiconductor layer on the active region.

* * * * *